United States Patent
Wang et al.

(10) Patent No.: US 6,583,980 B1
(45) Date of Patent: Jun. 24, 2003

(54) SUBSTRATE SUPPORT TOLERANT TO THERMAL EXPANSION STRESSES

(75) Inventors: You Wang, Cupertino, CA (US); Arnold Kholodenko, San Francisco, CA (US); Shamouil Shamouilian, San Jose, CA (US); Alexander M. Veytser, Mountain View, CA (US); Wing L. Cheng, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 143 days.

(21) Appl. No.: 09/641,536

(22) Filed: Aug. 18, 2000

(51) Int. Cl.⁷ .......................... H01G 3/00; H01T 23/00
(52) U.S. Cl. ........................................ 361/234; 361/233
(58) Field of Search .............................. 361/234, 233; 165/81, 80

(56) References Cited

U.S. PATENT DOCUMENTS

| | | | |
|---|---|---|---|
| 4,846,928 A | | 7/1989 | Dolins et al. ................ 156/626 |
| 5,191,506 A | * | 3/1993 | Logan et al. ................ 361/234 |
| 5,332,200 A | | 7/1994 | Gorin et al. ................ 266/280 |
| 5,376,213 A | | 12/1994 | Ueda et al. ................ 156/345 |
| 5,426,558 A | * | 6/1995 | Sherman ..................... 361/234 |
| 5,452,177 A | * | 9/1995 | Frutiger ..................... 361/234 |
| 5,511,799 A | | 4/1996 | Davenport et al. .......... 277/236 |
| 5,522,131 A | * | 6/1996 | Steger ........................ 29/829 |
| 5,535,090 A | | 7/1996 | Sherman ..................... 361/234 |
| 5,535,507 A | * | 7/1996 | Barnes et al. ................ 29/825 |
| 5,671,116 A | * | 9/1997 | Husain ........................ 361/234 |
| 5,737,178 A | * | 4/1998 | Herchen ..................... 361/234 |
| 5,738,751 A | * | 4/1998 | Camerson .................... 156/345 |
| 5,792,423 A | * | 8/1998 | Donde et al. ................ 361/234 |
| 5,867,359 A | | 2/1999 | Sherman ..................... 361/234 |
| 5,883,778 A | * | 3/1999 | Sherstinsky et al. ........ 361/234 |
| 5,914,568 A | * | 6/1999 | Nonaka .................... 315/111.21 |

FOREIGN PATENT DOCUMENTS

JP          09153481 A   *  6/1997   ........... C23C/16/50

* cited by examiner

*Primary Examiner*—Brian Sircus
*Assistant Examiner*—Z Kitov
(74) *Attorney, Agent, or Firm*—Ashok K. Janah; Joseph Bach

(57) ABSTRACT

A chamber 30 for processing a substrate 25 comprises a support 55 including an electrode 70 at least partially covered by a dielectric 60 that is permeable to electromagnetic energy. The electrode 70 may be chargeable to electrostatically hold the substrate 25, to couple energy to a gas in the chamber 30, or both. A base 90 below the support 55 comprises a slot 95 that may be adapted to serve as a thermal expansion slot to reduce thermal stresses.

44 Claims, 3 Drawing Sheets

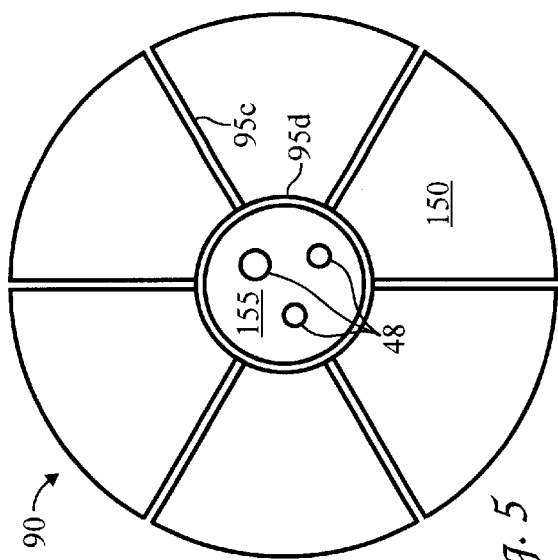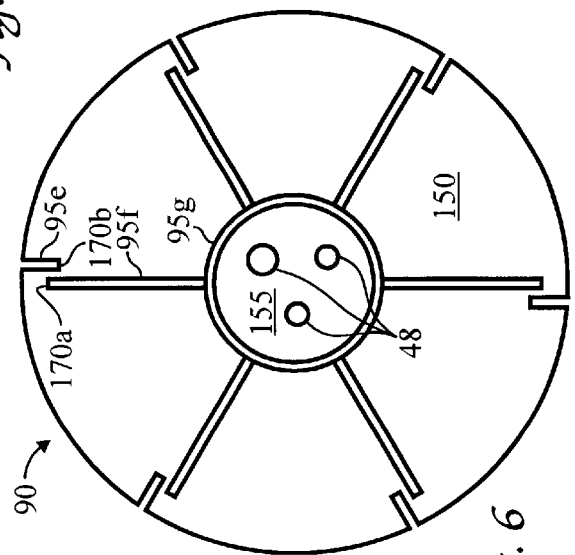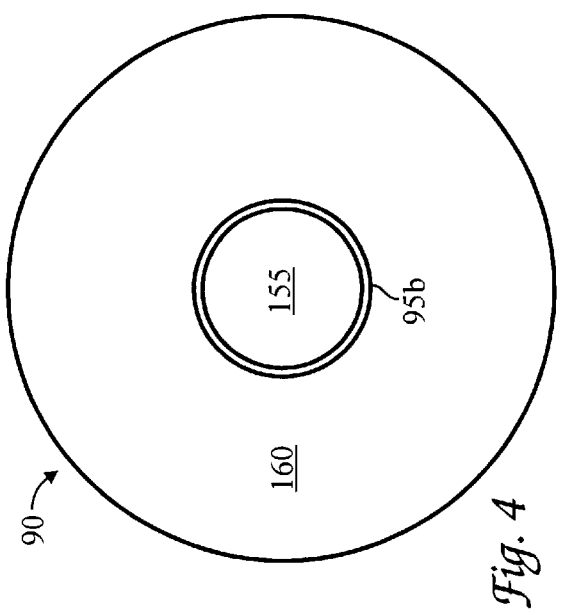

SUBSTRATE SUPPORT TOLERANT TO THERMAL EXPANSION STRESSES

BACKGROUND

The invention relates to a support for supporting a substrate in a chamber and related methods of use and manufacture.

In the manufacture of integrated circuits, a substrate is processed by a plasma of process gas in a chamber. The substrate is typically supported in the chamber by a support, a portion of which may comprise a dielectric material covering an electrode. The electrode may be charged to electrostatically hold the substrate, to energize the process gas in the chamber, or to do both. In addition, the support may comprise a heater to heat the substrate, or a heat exchanger, such as for example, channels through which heat transfer fluid may be circulated to heat or cool the substrate. A heat transfer gas, such as helium, may also be introduced below the substrate to enhance heat transfer rates to and from the substrate.

The substrate fabrication process may be performed at elevated temperatures and using erosive gases. Temperatures exceeding 100° C. in combination with gases such as halogen gases—may result in rapid thermally degradation of the support. The erosion and temperature resistance may be met by polymer or ceramic materials, such as for example, polyimide, aluminum oxide and aluminum nitride. However, it is difficult to attach such polymer or ceramic supports to the chamber which is typically made from a metal. For example, differences in thermal expansion coefficient between the support and the chamber, or differences in temperature across the thickness of the support, may cause thermal expansion stresses that result in cracking or fracturing of either structure or at their joints and interfaces.

Another problem that often occurs with conventional supports arises because the heat transfer gas passed through the conduit in the support may leak out from the joints in the conduit, especially at the interfaces between different sections. A loss in pressure of the heat transfer gas during processing may cause non-uniform heat transfer rates, and consequently non-uniform temperatures, across the substrate. It is desirable to maintain uniform heat transfer rates from, and temperatures across, the substrate during its processing otherwise the substrate may be processed unevenly.

Therefore, it is desirable to have a support that may be used at elevated temperatures without uncontrolled thermal expansion or adverse thermal stresses. It is further desirable to maintain uniform heat transfer rates and temperatures across a substrate during its processing. It is also desirable to be pass heat transfer gas through conduits in the support without excessive leakage of the gas from joints and interfaces.

SUMMARY

The present invention satisfies these needs. In one aspect, the present invention comprises a substrate support capable of holding a substrate in a chamber, the substrate support comprising at least one support section having a slot extending through the thickness of the support section, the slot being shaped and sized to reduce adverse thermal expansion effects during use of the support in the chamber.

In another aspect, the invention comprises a substrate support comprising an electrode, a dielectric at least partially covering the electrode, and a base below the electrode, the base comprising a thermal expansion slot.

In yet another aspect, the invention comprises a substrate processing chamber including a substrate support comprising an electrode that is at least partially covered by a dielectric and an underlying base comprising a slot, a gas distributor, a gas energizer, and a gas exhaust, whereby a substrate received on the support may be processed by gas introduced through the gas distributor, energized by the gas energizer and exhausted by the gas exhaust.

In a further aspect, the invention comprises a method of fabricating a substrate support comprising the steps of forming an electrode, covering the electrode at least partially with a dielectric, forming a base to support the electrode, and forming a thermal expansion slot in the base.

In a further aspect, the invention comprises a support capable of holding a substrate in a chamber, the support comprising a plurality of support sections that are joined to one another by at least one bond comprising a plurality of layers.

DRAWINGS

These features, aspects, and other advantages of the present invention will become better understood with regard to the following description, appended claims, and accompanying drawings which illustrate examples of the invention, where:

FIG. 2c is a schematic sectional view of a detail of the bond layer of the support of FIG. 2a;

FIG. 4 is a schematic partial sectional top view of another version of a support according to the present invention;

FIG. 5 is a schematic partial sectional top view of another version of a support according to the present invention; and FIG. 6 is a schematic partial sectional top view of another version of a support according to the present invention.

DESCRIPTION

Figure 1:
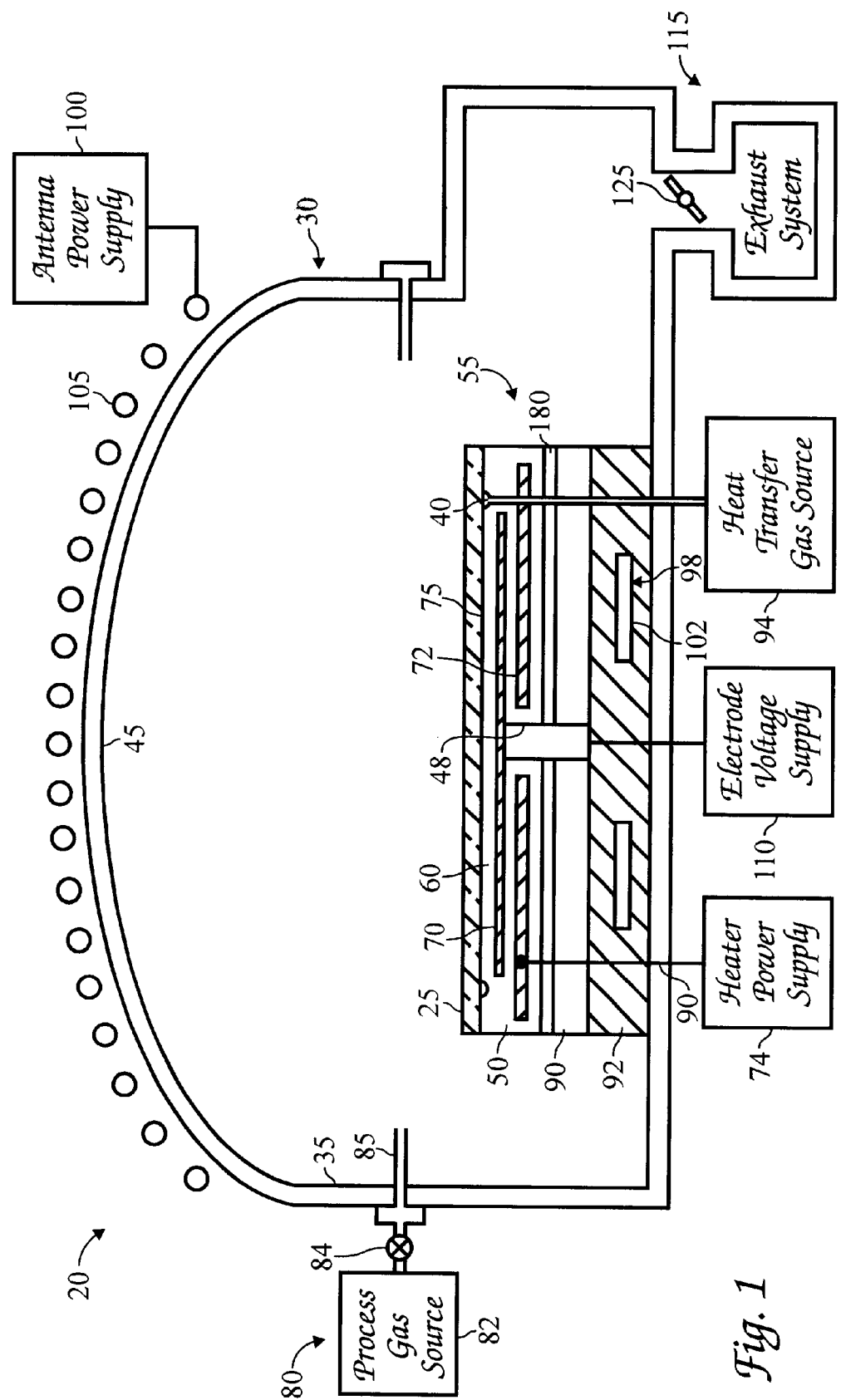
FIG. 1 is a schematic side view of a chamber and support according to the present invention.

An apparatus 20 for processing a substrate 25 in an energized gas or plasma, may be for example, a "DPS" chamber (as schematically illustrated in FIG. 1), an IPS chamber, or a MxP+chamber–all of which are commercially available from Applied Materials, Inc., Santa Clara, Calif. The exemplary version of the apparatus 20 shown herein is suitable for processing substrates 25 such as semiconductor wafers, and may be adapted by those of ordinary skill to process other substrates, such as a flat panel display, polymer panel, or other structures for electronic applications. The apparatus 20 is provided only to illustrate the invention and should not be used to limit the scope of the invention or its equivalents. The apparatus 20 may be attached to a multichamber platform (not shown) that provides electrical, plumbing, and other support functions for the apparatus 20, such as for example, the Precision 5000™ systems from Applied Materials, Inc., of Santa Clara, Calif.

Generally, the apparatus 20 comprises an enclosed chamber 30 having sidewalls 35, a ceiling 45, and a support 55 for supporting the substrate 25. Gas is introduced into the chamber 30 by a gas supply 80 comprising a plurality of gas nozzles 85 that are fed from a process gas source 82, the gas flow being controlled by one or more gas valves 84. The gas may be energized by coupling electromagnetic energy, such as RF or microwave energy, to the gas. In the exemplary apparatus 20, a plasma of energized gas is sustained by inductively coupling RF power from an inductor antenna 105 adjacent to the ceiling 45 of the chamber 30, the antenna 105 being powered by a power supply 100. Optionally, the gas may be further energized capacitively by applying an RF voltage from an electrode voltage supply 110 to an electrode 70 in the support 55 and by electrically grounding the walls of the chamber 30. Spent gas and byproducts are exhausted from the chamber 30 through an exhaust system 115 which typically includes vacuum pumps (not shown) and a throttle valve 125 to control the pressure in the chamber 30. The apparatus 20 illustrated herein may be used to etch material from a substrate 25, as generally described, for example, in *VLSI Technology*, by S. M. Sze, McGraw-Hill Publishing Company (1988), which is incorporated herein by reference.

In operation, the substrate 25 is transferred from a load-lock or transfer chamber and placed on a support 55. The support 55 comprises one or more support sections 50, 90, 92, that comprise a diameter that is sized in relation to the size of the substrate 25 that is supported by the support 55. One of the support sections 50, 90, 92, has a receiving surface 75 for receiving the substrate 25. In one version, the receiving surface 75 is a surface of an electrostatic chuck 50 that may be used to electrostatically hold the substrate 25. The electrostatic chuck 50 comprises a dielectric 60 at least a portion of which covers the electrode 70 and whose other portions may partially surround or entirely enclose the electrode 70. The dielectric 60 may also comprise holes 40, which include gas conduits to supply heat transfer gas from a heat transfer gas source 94 to the receiving surface 75 and bores 48 for the passage of electrical connectors to the electrode 70, a heater 72 as described below, or lift pins (not shown) through the dielectric 60. Typically, the dielectric 60 is made from a material that is resistant to erosion by the gas or plasma. The dielectric 60 may preferably also be permeable to RF or DC energy applied to the electrode 70.

In an exemplary version, the dielectric 60 comprises a ceramic material, such as for example, aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof. Generally, aluminum nitride is preferred for its high thermal conductivity which provides high heat transfer rates from the substrate 25. Aluminum nitride also exhibits good chemical resistance to erosive environments, such as halogen-containing environments. The ceramic dielectric 60 is permeable to electromagnetic energy, such as RF energy, to allow energy applied to the electrode 70 to couple to the gas in the chamber 30 to sustain or energize a plasma of the gas. The ceramic dielectric 60 may also be partially conductive to allow a current flow therethrough to establish an electrostatic charge that is not confined to the electrode 70 to provide a stronger electrostatic clamping force on the substrate 25. The ceramic dielectric 60 may be formed by freeze casting, injection molding, pressure-forming, thermal spraying, or sintering a ceramic block having the electrode 105. For example, a ceramic powder may be formed into a coherent mass in a pressure forming process under pressure and an elevated temperature. Suitable pressure forming apparatuses include autoclaves, platen presses, and isostatic presses, as for example, described in U.S. patent application Ser. No. 08/965,690, filed Nov. 6, 1997; which is incorporated herein by reference.

The electrode 70 covered by and below the dielectric 60 may be adapted to be electrically charged to electrostatically hold the substrate 25 to the receiving surface 75, adapted to energize the gas in the chamber 30, or adapted to do both. For electrostatic clamping, the electrode 70 may be a monopolar or bipolar electrode. The electrode 70 is made from an electrically conducting material, such as a metal, for example, aluminum, copper, tungsten, molybdenum or mixtures thereof. Molybdenum has a good thermal conductivity and resistance in corrosion in nonoxidizing environments, such as when the electrode 70 is embedded in the dielectric 60. The electrode 70 comprises a generally planar shape conformal to the shape of the substrate 25. For example, the electrode 70 may be a mesh of electrically conducting wire (not shown) extending below substantially the entire substrate 25.

The electrostatic chuck 50 may also include a heater 72 to heat the substrate which is typically an electrical resistor. The heater 72 extends below the plane of the substrate 25. The heater 72 may comprise, for example, tungsten, molybdenum, iron, nickel, copper, Inconel™ or alloys thereof. A heater power supply 74 may be used to electrically power the heater 72.

The support 55 further includes a base 90 below the dielectric 60 and electrode 70; and optionally, a pedestal 92 below the base 90. The base 90 and optional pedestal 92 facilitate attachment of the chuck 50 to the chamber 30 and may also serve to control the rates of heat transfer between the chuck 50 and the chamber 30. Also, the base 90 or pedestal 92 may comprise a heat exchanger 98 to maintain substantially uniform temperatures across the substrate 30. A typical heat exchanger 98 may comprise channels 102 through which a heat transfer fluid may be circulated to heat or cool the substrate 25. The pedestal is typically fabricated from a metal such as aluminum, but it may also be fabricated from a ceramic such as aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof.

The base 90 is shaped and sized to match the shape and size of the chuck 50 to provide more uniform heat transfer rates. For example, when the chuck 50 is disk shaped, the base 90 may comprise a matching right cylinder having the same diameter. The base 90 may also be made from a ceramic material, such as one or more of aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof. Optionally, the base 90 may be also made of a material having a coefficient of thermal expansion that is close to the dielectric 60 of the chuck 50 to further reduce thermal stresses therebetween. Such a base 90 has a coefficient of thermal expansion (CTE) within about ±20% of the CTE of that of the electrostatic chuck 50. For example, when the dielectric 60 comprises aluminum nitride, the base 90 may be made from a material having a coefficient of thermal expansion of from about 4 to about 7 ppm/° C., such as mullite, to provide a suitable level of CTE matching between the base 90 and the chuck 50.

One or more of the support sections 50, 90, 92 of the support 55 comprise a slot 95 that extends through the thickness of the section, the slot 95 being shaped and sized to reduce adverse thermal expansion effects during use of the support 50, 90, 92 in the chamber. In one version, the slot 95 provides thermal expansion compensation to compensate for a thermal expansion mismatch of one or more of the support sections to reduce thermal stresses therebetween. For example, FIG. 2b illustrates an embodiment of the present invention in which the base 90 comprises a thermal expansion slot 95. The thermal expansion slot 95 may extend substantially vertically through the thickness of any one or more of the support sections 50, 90, 92. While the slot 95 is illustrated in the base 90, it may be also positioned in the electrostatic chuck 50, pedestal 92, in two of the sections, or in all three sections. The slot 95 is adapted to reduce thermal stresses arising from any thermal expansion mismatch of the electrostatic chuck 50, base 90, or pedestal 92. The thermal expansion slot 95 includes a gap that is shaped and sized to allow adjacent portions 140a, 140b of the support section, such as for example the base 90, to expand into the gap at elevated temperatures. Such expansion may occur because of an increase in temperature of any of the support sections 50, 90 or 92. For example, the thermal expansion slot 95 may be used to reduce the effect of a linear expansion of the base 90—for example, on the overlying dielectric 60 or electrode 70—by taking in or absorbing the thermally induced dimensional change into the gap. Thus, the thermal expansion slot 95 comprises a gap that is, typically, sized larger than a net dimensional change that would occur when the base 90 is increased from a low temperature to a substrate processing temperature or vice versa. For example, the thermal expansion slot 95 may comprise a single line cut extending through the thickness of the base 90, having a substantially vertical orientation, and stretching from a perimeter 130 to a center 135 of the base 90 to define the two semicircular portions 140a, 140b on either side that may expand into the slot 95 during processing of the substrate 25.

The shape and dimensions of the slot 95 depends upon the diameter and thickness of the base 90, its coefficient of thermal expansion, the difference in CTE between the chuck 50, base 90, or pedestal 92, and the change in temperature or temperature gradient that they are subjected to during the processing of a substrate 25. For example, the slot 95 may be shaped as a linear, partially circular, parabolic or elliptical gap, and the slot 95 may extend through the support sections 50, 90 or 92, continuously or in segments. Typically, the slot 95 comprises a gap sized of from about 0.1 mm to about 5 mm, for a base 90 having a diameter of from about 200 mm to about 500 mm. Thus the ratio of the size of the gap of the slot 95 to a diameter of a support section 50, 90, 92 is typically from about 0.0002 to about 0.025. As an example, for a support comprising an electrostatic chuck made of AlN dielectric having an embedded Mo electrode, and a base 90 made of mullite having a diameter of about 212 mm and a thickness of 21 mm, a suitable thermal expansion slot 95 comprises a gap sized from about 0.5 to about 1 mm.

Figure 3:
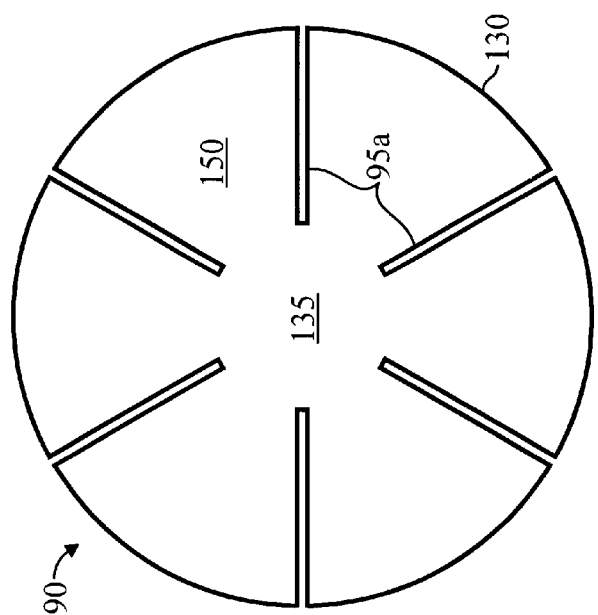
FIG. 3 is a schematic partial sectional top view of another support according to the present invention.

The slot 95 may be cut across a portion, or substantially the entire thickness, of the support sections 50, 90 or 92 depending upon the calculated thermal expansion. Typically, the slot 95 is cut through substantially the entire thickness of the support sections 50, 90, 92 to compensate for the expansion of two semicircular portions 140a, 140b of the support sections on either side of the slot 95 as illustrated in FIG. 2b, or for example, to compensate for the thermal expansion of pie-shaped wedges 150 on either side of the slots 95a as illustrated in FIG. 3. Thus the slot 95 or slots 95a may be shaped to absorb the expansion of the base 90 and reduces thermal stresses on the overlying electrostatic chuck 50 or other underlying pedestal 92, or on the base 90 itself.

The geometrical configuration and number of thermal expansion slots 95 may also depend upon the shape of the support sections 50, 90, 92, the difference in CTE between the base 90 and the overlying electrode 70 or dielectric 60, or the underlying pedestal 92, and the processing temperature of the substrate 25. In the version shown in FIG. 3, a plurality of thermal expansion slots 95a each comprise a cut extending radially across the support sections 50, 90, 92 from its perimeter 130 to its center 135. The slots 95a may be uniformly spaced apart along the perimeter 130 and converge toward the center 135 of the support sections 50, 90, 92. At the perimeter 130, the slots 95a comprise a gap sized to absorb the volume or linear thermal expansion of the outer peripheral region of the support sections 50, 90, 92 which is often higher than the volume or linear expansion at central region of the support sections 50, 90, 92. Typically, the support sections 50, 90, 92 is cut to form from about 2 to about 12 slots and more typically from 3 to 8 slots.

In an alternative version, as illustrated in FIG. 4, a slot 95b may comprise a circular cut that extends circumferentially across the support sections 50, 90, 92, for example, across a radially inner portion 155 of the base 90 (as shown) or a radially outer peripheral portion 160 of the base 90 (not shown). The slot 95b may also comprise two or more segments that each extend across a portion of a central or peripheral circumference of the base 90 to form one or more circular rings 95b isolates the expansion of the outer peripheral portion 160 of the base 90 from the inner portion 155. This version is particularly useful when the base 90 is made from a plurality of materials, such as a first material for the inner ring portion 155, for example zirconium alloy, and a second material for the outer ring portion 160, for example mullite. The annular gap created by the thermal expansion slot 95 is useful to allow the thermal expansion of the inner and outer portions 155, 160 into the gap to alleviate thermal expansion stresses of the base 90.

In another version, as illustrated in FIG. 5, the base 90 comprises first thermal expansion slots 95c that extend radially across the base 90 to form the wedges 150 and a second thermal expansion slot 95d that extends in a circular direction across the base 90 to form the central portion 155. This version is useful when the base 90 has a particularly high CTE or CTE mismatch with the electrostatic chuck 50. Placing the thermal expansion slots 95c, 95d in both the radial and circumferential directions serves to further reduce the thermal expansion stresses that result from the CTE mismatch in both the radial and circumferential directions. In these versions, the base 90 comprises holes 48 at its central region 155 for the passage of electrical connectors for the electrode 70 or the heater 72.

FIG. 6 illustrates another version in which the radially oriented thermal expansion slots 95e and 95f are radially offset from one another. The slots 95e and 95f are interdigited or interlaced with their tips 170a, 170b abutting one another or crossing over one another. This version provides good thermal expansion absorption properties with the increased structural strength because the slots 95e, 95f do not cut across the entire surface of the base 90. Optionally, the base 90 may further include a circular slot 95g to further increase the ability of the base 90 to withstand thermal expansion stresses.

Figure 2C:
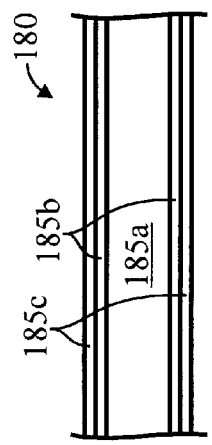
Figure 2A:
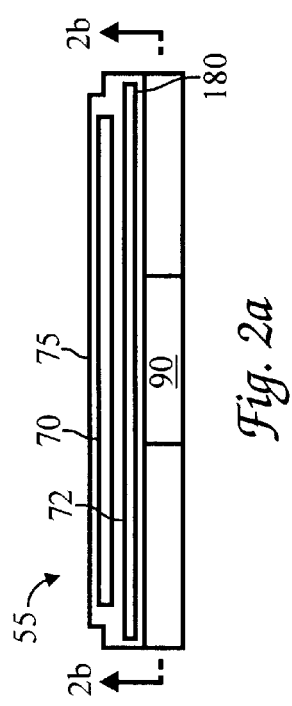
FIG. 2a is a schematic sectional side view of a support according to the present invention showing an electrostatic chuck, a bond layer, and a base having conduits therethrough.
Figure 2B:
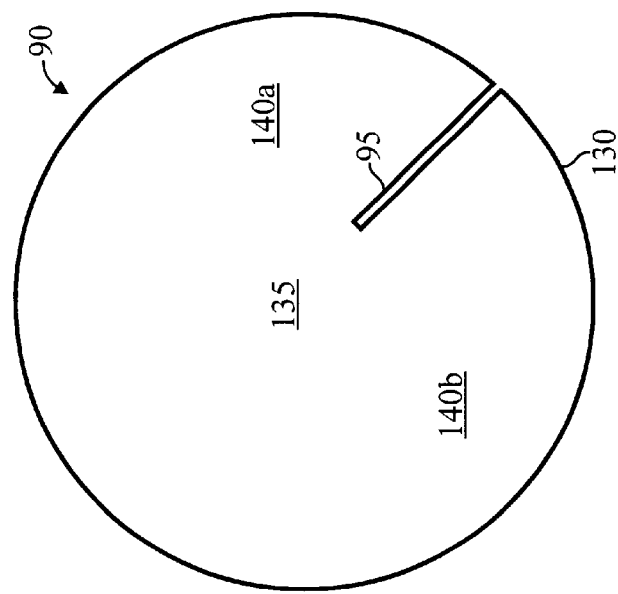
FIG. 2b is a schematic sectional top view of the base of the support of FIG. 2a showing a thermal expansion slot in the base.

Referring to FIGS. 2a and 2c, optionally, the chuck 50 may be bonded to the base 90 by a bond 180 comprising one or more layers 185a–c. The bond 180 may be compliant or ductile to allow further absorption of thermal stresses that arise from differences in thermal expansion coefficients of dissimilar materials, such as for example, an AlN ceramic chuck 50 and a mullite base 90, thereby reducing thermomechanical stresses. The bond 180 may also provide more uniform heat transfer rates from the electrostatic chuck 50 and base 90. Differences in thermal impedances can occur, for example, at the interface therebetween, especially when the base 90 or electrostatic chuck 50 has a surface with non-contacting regions. The effect of these thermal impedances is reduced by the bond layer 180.

The bond 180 may also serve to reduce leakage of heat transfer gas passing through the conduit 40 to provide a gas sealed joint with lower leakage rates at the interface of the chuck 50 and base 90. The bond 180 may comprise compliant metals such as one or more layers of aluminum, copper, iron, molybdenum, titanium, tungsten or alloys thereof. For example, for a chuck 50 comprising a dielectric 60 made of aluminum nitride (which has a CTE of about 5.5 ppm/° C.) and an electrode 70 made of molybdenum (which has a CTE of about 5.1 ppm/° C.) to be bonded to a mullite base 90 (which has a CTE of about 4 to 7 ppm); a suitable sequence of metal layers, as illustrated in FIG. 2c, comprises a Mo foil (185a) covered with a copper layer (185b) which has a CTE of from about 5 to about 10 ppm/° C. A brazed metal layer 185c may be used to braze the metal layers 185a, 185b to the chuck 50. The brazing alloy should have a melting point lower than the dielectric 60 or base 90. In fabrication, a thin sheet of brazing metal (not shown) is placed between the electrostatic chuck 50 and the base 90 and heated to allow the metal to soften and react to form the strong and ductile bond layer 180. The brazing metal typically comprises aluminum, zinc, copper, silicon, or alloys thereof. For example, a suitable brazing alloy comprises Cusin-1-ABA which melts at 775° C. Also, the bond layer may include an Al/SiC layer (porous silicon carbide infiltrated with aluminum), as for example, described in U.S. patent application Ser. No. 09/306,934, filed May 7, 1999, which is incorporated herein by reference in its entirety.

In another method of bonding the base 90 to the electrostatic chuck 50, a molten or liquid metal material is infiltrated between the chuck 50 and the base 90 in a pressure vessel. The metal infiltration can be accomplished by, for example, melting the metal and allowing the molten metal to infiltrate the interface by capillary action. The infiltration may also be performed in a pressure vessel (not shown) using a pressure infiltration process operated at a pressure of from about 10 psi to about 500 psi (500 to 30,000 Torr), and more typically from about 100 psi to 300 psi. The molten metal is maintained at its melting or softening point during the pressure infiltration process and in a non-reactive gas environment, such in nitrogen or argon gas. The pressure forming apparatus may also be evacuated to remove air trapped at the interface of the chuck 50 and base 90 using conventional vacuum bag methods, as for example, described in U.S. Pat. No. 5,745,331. Suitable pressure forming apparatuses include autoclaves, platen presses or isostatic presses. In the infiltration process, the molten metal may react with the dielectric 70 to form an interfacial reaction layer that is free of voids and provides uniform thermal transfer rates across the interface. Also, a porous preform (preferably silicon carbide) may be placed between the chuck 50 and the base 90 during the infiltration process, so that the molten metal (preferably aluminum) infiltrates the pores and the surfaces between the chuck 50 and the base 90, to form the bond layer 180, as for example, described in the aforementioned U.S. patent application Ser. No. 09/306, 934.

While the present invention has been described in considerable detail with reference to certain preferred versions, many other versions should be apparent to those of ordinary skill in the art. For example, other geometrical configurations, shapes, and sizes of slots 95 may be used. In addition, the support 55 may be used in other chambers, such as for example, CVD, PVD, ion implantation, RTD and other chambers. Therefore, the spirit and scope of the appended claims should not be limited to the description of the preferred versions contained herein.

What is claimed is:

1. A support capable of holding a substrate in a chamber, the support comprising at least one support section that supports an electrostatic chuck, the support section having a slot extending through the thickness of the support section without cutting across an entire surface of the support section, the slot being shaped and sized to reduce adverse thermal expansion effects during use of the support in the chamber.

2. A support according to claim 1 wherein the slot extends substantially vertically through the support section.

3. A support according to claim 1 wherein the slot extends radially or circumferentially across a portion of the support section.

4. A support according to claim 1 wherein the slot comprises a gap and the support section comprises a diameter, and wherein the ratio of the size of the gap to the diameter of the support section is from about 0.0002 to about 0.025.

5. A support according to claim 1 wherein the slot comprises a radial or circular cut.

6. A support according to claim 1 comprising a plurality of slots.

7. A support according to claim 6 wherein at least a pair of slots are radially offset from one another.

8. A support according to claim 1 wherein the support section comprises a diameter sized in relation to the size of a substrate that may be supported by the support section.

9. A support according to claim 1 wherein the support section comprises an electrostatic chuck, base or pedestal.

10. A support according to claim 1 wherein the support section comprises one or more of aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof.

11. A substrate support comprising:
an electrostatic chuck comprising an electrode and a dielectric at least partially covering the electrode; and
a base below the electrode, the base comprising a slot that extends through the thickness of the base without cutting across an entire surface of the base.

12. A support according to claim 11 wherein the slot is adapted to reduce a thermal expansion stress of the substrate support.

13. A support according to claim 11 wherein the slot comprises a gap and the base comprises a diameter, and wherein the ratio of the size of the gap to the diameter of the base is from about 0.0002 to about 0.025.

14. A support according to claim 11 wherein the slot extends radially or circumferentially across a portion of the base.

15. A support according to claim 11 wherein the slot comprises a radial or circular cut across a portion of the base.

16. A support according to claim 11 comprising a plurality of slots.

17. A support according to claim 16 wherein at least a pair of slots are radially offset from one another.

18. A support according to claim 11 wherein the base comprises one or more of aluminum oxide, aluminum nitride, boron nitride, boron carbide, carbon, cordierite, mullite, silicon, silicon carbide, silicon nitride, silicon oxide, titanium oxide, zirconium oxide, or mixtures and compounds thereof.

19. A support according to claim 11 wherein the dielectric is bonded to the base by a metal layer.

20. A support according to claim 19 wherein the metal layer comprises one or more of aluminum, copper or molybdenum.

21. A substrate processing chamber comprising:
   a substrate support comprising a dielectric at least partially covering an electrode, and an underlying base comprising a slot that extends through the thickness of the base without cutting across an entire surface of the base;
   a gas distributor;
   a gas energizer; and
   a gas exhaust,
   whereby a substrate received on the substrate support may be processed by gas introduced through the gas distributor, energized by the gas energizer, and exhausted by the gas exhaust.

22. A chamber according to claim 21 wherein the slot in the base comprises a thermal expansion slot.

23. A chamber according to claim 22 wherein the thermal expansion slot extends radially or circumferentially across the base.

24. A method of fabricating a substrate support, the method comprising the steps of:
   forming an electrostatic chuck by forming an electrode and covering the electrode at least partially with a dielectric;
   forming a base to support the electrode; and
   forming a thermal expansion slot in the base such that the thermal expansion slot extends through the thickness of the base without cutting across an entire surface of the base.

25. A method according to claim 24 comprising forming a thermal expansion slot that extends radially or circumferentially across a portion of the base.

26. A method according to claim 24 comprising cutting out the thermal expansion slot in the base.

27. A method according to claim 24 comprising bonding the dielectric to the base.

28. A method according to claim 27 comprising bonding the dielectric to the base by one or more metal layers.

29. A method according to claim 27 comprising bonding the dielectric to the base by brazing or infiltration.

30. A support capable of holding a substrate in a chamber, the support comprising a plurality of support sections that are joined to one another by at least one bond comprising a plurality of layers, the plurality of layers comprising different materials.

31. A support according to claim 30 wherein the materials include one or more metals.

32. A support according to claim 31 wherein the metals comprise one or more of aluminum, copper, iron, molybdenum, titanium, tungsten or alloys thereof.

33. A support according to claim 30 wherein at least one support section comprises a slot extending through the thickness of the support section.

34. A support according to claim 33 wherein the slot is shaped and sized to reduce adverse thermal expansion effects during use of the support in the chamber.

35. A support according to claim 30 wherein the slot extends radially or circumferentially across a portion of the support section.

36. A support capable of holding a substrate in a chamber, the support comprising at least one support section and a slot extending through the thickness of the section, the slot comprising a gap that is shaped and sized to reduce adverse thermal expansion effects during use of the support in the chamber, and the ratio of the size of the gap to a diameter of the support section hyping from about 0.0002 to about 0.025.

37. A substrate support comprising:
   an electrostatic chuck comprising an electrode and a dielectric at least partially covering the electrode; and
   a base below the electrode, the base comprising a slot that comprises a gap, and the ratio of the size of the gap to a diameter of the base being from about 0.0002 to about 0.025.

38. A substrate support comprising:
   an electrostatic chuck comprising an electrode and a dielectric at least partially covering the electrode; and
   a base below the electrode and bonded to the dielectric by a metal layer, the base comprising a slot.

39. A method of fabricating a substrate support, the method comprising the steps of:
   forming an electrostatic chuck by forming an electrode and covering the electrode at least partially with a dielectric;
   forming a base to support the electrode;
   forming a thermal expansion slot in the base; and
   bonding the dielectric to the base by one or more metal layers.

40. A method of fabricating a substrate support, the method comprising the steps of:
   forming an electrostatic chuck by forming an electrode and covering the electrode at least partially with a dielectric;
   forming a base to support the electrode; and
   cutting out a thermal expansion slot in the base.

41. A support according to claim 1 wherein the support section has a plurality radially offset slots that are interdigited or interlaced without cutting across the entire surface of the section.

42. A support according to claim 11 wherein the base comprises a plurality of radially offset slots that are interdigited or interlaced without cutting across the entire surface of the base.

43. A chamber according to claim 21 wherein the base comprises a plurality of radially offset slots that are interdigited or interlaced without cutting across the entire surface of the base.

44. A method according to claim 24 comprising forming a plurality of radially offset thermal expansion slots in the base such that the thermal expansion slots are interdigited or interlaced without cutting across the entire surface of the base.

* * * * *